United States Patent
Ishikawa et al.

(10) Patent No.: US 10,180,462 B2
(45) Date of Patent: Jan. 15, 2019

(54) DIAGNOSTIC DEVICE

(71) Applicants: TOYOTA JIDOSHA KABUSHIKI KAISHA, Toyota-shi, Aichi-ken (JP); NIPPON SOKEN, INC., Nishio, Aichi (JP)

(72) Inventors: Yuji Ishikawa, Nukata-gun (JP); Takashi Yamamoto, Kariya (JP); Shigeki Hasegawa, Toyota (JP); Syuya Kawahara, Toyota (JP)

(73) Assignees: Toyota Jidosha Kabushiki Kaisha, Toyota-shi, Aichi-ken (JP); Nippon Soken, Inc., Nishio, Aichi (JP)

( * ) Notice: Subject to any disclaimer, the term of this patent is extended or adjusted under 35 U.S.C. 154(b) by 316 days.

(21) Appl. No.: 15/241,167

(22) Filed: Aug. 19, 2016

(65) Prior Publication Data

US 2017/0059663 A1    Mar. 2, 2017

(30) Foreign Application Priority Data

Aug. 27, 2015 (JP) ................. 2015-168057

(51) Int. Cl.
  *G01N 27/416* (2006.01)
  *G01R 31/36* (2006.01)
  (Continued)

(52) U.S. Cl.
  CPC .... *G01R 31/3662* (2013.01); *H01M 8/04447* (2013.01); *H01M 8/04455* (2013.01); *H01M 8/04552* (2013.01); *H01M 8/04559* (2013.01); *H01M 8/04582* (2013.01); *H01M 8/04589* (2013.01); *H01M 8/04641* (2013.01);
  (Continued)

(58) Field of Classification Search
  CPC ............ G01R 31/3662; G01R 31/3648; G01R 31/3658; G01R 31/3655; H01M 8/04641; H01M 8/04447; H01M 8/04559; H01M 8/04992; H01M 8/04649
  See application file for complete search history.

(56) References Cited

U.S. PATENT DOCUMENTS

2009/0068506 A1 * 3/2009 Tomura ............... H01M 8/0269
                                                          429/431
2009/0110985 A1    4/2009 Manabe et al.
(Continued)

FOREIGN PATENT DOCUMENTS

CN    101213698 A    7/2008
CN    101243571 A    8/2008
(Continued)

*Primary Examiner* — Minh N Tang
(74) *Attorney, Agent, or Firm* — Finnegan, Henderson, Farabow, Garrett & Dunner, LLP

(57) ABSTRACT

An AC component $\Delta I$ addition unit of a diagnostic device superimposes an alternating current on an output current of a fuel cell. A Zn calculation unit calculates a cell impedance with respect to the alternating current with regard to any of a plurality of cells. A diagnosis unit diagnoses that any cell is subjected to hydrogen deficiency when an absolute value of the cell impedance exceeds (absolute value of a reference impedance+a predetermined value $\beta$). It is diagnosed that any cell is subjected to oxygen deficiency when the absolute value of the cell impedance is smaller than (absolute value of the reference impedance−a predetermined value $\alpha$).

14 Claims, 6 Drawing Sheets

(51) Int. Cl.
   *H01M 8/04537* (2016.01)
   *H01M 8/04664* (2016.01)
   *H01M 8/04746* (2016.01)
   *H01M 8/0444* (2016.01)
   *H01M 8/1018* (2016.01)

(52) U.S. Cl.
   CPC ... *H01M 8/04649* (2013.01); *H01M 8/04671* (2013.01); *H01M 8/04753* (2013.01); *H01M 2008/1095* (2013.01); *H01M 2250/20* (2013.01); *Y02T 90/32* (2013.01)

(56) References Cited

U.S. PATENT DOCUMENTS

| | | |
|---|---|---|
| 2009/0286109 A1 | 11/2009 | Araki |
| 2010/0141262 A1* | 6/2010 | Watanabe .......... H01M 8/04119 324/430 |
| 2010/0216043 A1 | 8/2010 | Gottmann et al. |
| 2010/0239930 A1* | 9/2010 | Umayahara ....... H01M 8/04492 429/432 |
| 2011/0269046 A1* | 11/2011 | Suematsu ......... H01M 8/04641 429/450 |
| 2012/0038373 A1 | 2/2012 | Ikeda et al. |
| 2014/0295302 A1 | 10/2014 | Ishikawa et al. |

FOREIGN PATENT DOCUMENTS

| | | |
|---|---|---|
| JP | 2005-332702 A | 12/2005 |
| JP | 2012-252986 | 12/2012 |
| JP | 2013-8568 | 1/2013 |
| JP | 2013-140715 | 7/2013 |
| WO | WO 2010/128555 A1 | 11/2010 |

\* cited by examiner

DIAGNOSTIC DEVICE

INCORPORATION BY REFERENCE

The disclosure of Japanese Patent Application No. 2015-168057 filed on Aug. 27, 2015 including the specification, drawings and abstract is incorporated herein by reference in its entirety.

BACKGROUND OF THE INVENTION

1. Field of the Invention

The invention relates to a diagnostic device that diagnoses a state of a fuel cell.

2. Description of Related Art

A fuel cell system is known that is provided with a fuel cell in which a plurality of cells generating electric energy by using an electrochemical reaction of an oxygen gas and a hydrogen gas are stacked and an output control unit which generates an alternating current and an AC voltage in an output of the fuel cell (for example, refer to Japanese Patent Application Publication No. 2013-140715 (JP 2013-140715 A)).

This fuel cell system is provided with an impedance calculation unit and a hydrogen concentration calculation unit. The impedance calculation unit obtains an absolute value of an internal impedance of the fuel cell as a whole based on the alternating current and the AC voltage output from the fuel cell. The hydrogen concentration calculation unit calculates a hydrogen concentration of the fuel cell based on the absolute value of the internal impedance of the fuel cell.

In addition, in a fuel cell system that is disclosed in Japanese Patent Application Publication No. 2012-252986 (JP 2012-252986 A), a deficiency or non-deficiency in the oxygen gas or the hydrogen gas is diagnosed based on an impedance of any of the plurality of cells and the amount of a decrease in an output voltage of any of the plurality of cells.

Specifically, the impedance of any of the cells is measured, and then it is diagnosed that the cell is deficient in either the oxygen gas or the hydrogen gas when an absolute value of the measured impedance has increased. In addition, it is determined, in accordance with the amount of the decrease in the output voltage of the cell, whether the cell is deficient in the oxygen gas or the hydrogen gas.

In the fuel cell system that is disclosed in JP 2013-140715 A, it cannot be diagnosed for each of the cells whether the cell is deficient in the hydrogen concentration although the hydrogen concentration can be calculated with regard to the fuel cell as a whole.

The fuel cell system that is disclosed in JP 2012-252986 A requires the amount of the decrease in the output voltage of any of the cells, in addition to the absolute value of the impedance of the cell, for whether the cell is deficient in the hydrogen gas or the oxygen gas to be determined.

SUMMARY OF THE INVENTION

The invention provides a diagnostic device that diagnoses whether any cell is deficient in a hydrogen gas or an oxygen gas without using the amount of a decrease in an output voltage of the cell.

A first aspect of the invention relates to a diagnostic device diagnosing a state of a fuel cell in which a plurality of cells generating electric energy by using an electrochemical reaction of an oxidizing agent containing oxygen and a fuel containing hydrogen are stacked. The diagnostic device includes signal superimposition means for superimposing an alternating current on an output current of the fuel cell, first voltage detection means for detecting each of voltages output from the respective cells, second voltage detection means for detecting a voltage output from the fuel cell, current detection means for obtaining a current flowing through the plurality of cells, first calculation means for calculating a first low-frequency impedance with respect to the alternating current with regard to any of the plurality of cells based on the current detected by the current detection means and the voltage detected by the first voltage detection means, second calculation means for calculating a second low-frequency impedance of the entire fuel cell with respect to the alternating current or a third low-frequency impedance with respect to the alternating current with regard to a reference cell selected in advance among the plurality of cells as one of the cells in which a hydrogen deficiency is unlikely to occur based on the current detected by the current detection means and the voltages detected by the first and second voltage detection means and calculating a reference impedance based on the calculated second or third low-frequency impedance, and first determination means for determining whether an absolute value of the first low-frequency impedance calculated by the first calculation means exceeds an absolute value of the reference impedance, in which the first determination means diagnoses that any cell is in a state of the hydrogen deficiency when the first determination means determines that the absolute value of the first low-frequency impedance calculated by the first calculation means exceeds the absolute value of the reference impedance.

According to this diagnostic device, it can be diagnosed whether any of the cells is in the state of the hydrogen deficiency by the reference impedance being compared to the cell impedance and without the amount of a decrease in an output voltage of the cell being used.

A frequency within a range of 1 Hz to 200 Hz, for example, is used as the low frequency.

A second aspect of the invention relates to a diagnostic device diagnosing a state of a fuel cell in which a plurality of cells generating electric energy by using an electrochemical reaction of an oxidizing agent containing oxygen and a fuel containing hydrogen are stacked. The diagnostic device includes signal superimposition means for superimposing an alternating current on an output current of the fuel cell, first voltage detection means for detecting each of voltages output from the respective cells, second voltage detection means for detecting a voltage output from the fuel cell, current detection means for obtaining a current flowing through the plurality of cells, first calculation means for calculating a first low-frequency impedance with respect to the alternating current with regard to any of the plurality of cells based on the current detected by the current detection means and the voltage detected by the first voltage detection means, second calculation means for calculating a second low-frequency impedance of the entire fuel cell with respect to the alternating current or a third low-frequency impedance with respect to the alternating current with regard to a reference cell selected in advance among the plurality of cells as one of the cells in which an oxygen deficiency is unlikely to occur based on the current detected by the current detection means and the voltages detected by the first and second voltage detection means and calculating a reference impedance based on the calculated second or third low-frequency impedance, and third determination means for determining whether an absolute value of the first low-frequency impedance calculated by the first calculation means is smaller than an absolute value of the reference impedance, in which the first determination means diagnoses that any cell is in a state of the oxygen deficiency when the third determination means determines that the absolute value of the first low-frequency impedance calculated by the first calculation means is smaller than the absolute value of the reference impedance.

A third aspect of the invention relates to a diagnostic device which diagnoses a state of a fuel cell in which a plurality of cells that generates electric energy by an electrochemical reaction of an oxidizing agent containing oxygen and a fuel containing hydrogen are stacked. The diagnostic device comprises a first voltage detector that detects each of voltages output from the respective cells; a second voltage detector that detects a voltage output from the fuel cell; a current detector that obtains a current flowing through the plurality of cells; and a controller configured to superimpose an alternating current on an output current of the fuel cell, calculate a first low-frequency impedance with respect to the alternating current with regard to any of the plurality of cells based on the current detected by the current detector and the voltage detected by the first voltage detector, calculate a second low-frequency impedance of an entire fuel cell with respect to the alternating current or a third low-frequency impedance with respect to the alternating current with regard to a reference cell selected in advance among the plurality of cells as one of the cells in which a hydrogen deficiency is unlikely to occur based on the current detected by the current detector and the voltages detected by the first and second voltage detectors and calculate a reference impedance based on the calculated second or third low-frequency impedance, determine whether an absolute value of the calculated first low-frequency impedance exceeds an absolute value of the reference impedance, and diagnose that any cell is in a state of the hydrogen deficiency when it is determined that the absolute value of the calculated first low-frequency impedance exceeds the absolute value of the reference impedance.

A fourth aspect of the invention relates to a diagnostic device which diagnoses a state of a fuel cell in which a plurality of cells that generates electric energy by an electrochemical reaction of an oxidizing agent containing oxygen and a fuel containing hydrogen are stacked. The diagnostic device comprises a first voltage detector that detects each of voltages output from the respective cells; a second voltage detector that detects a voltage output from the fuel cell; a current detector that obtains a current flowing through the plurality of cells; and a controller configured to superimpose an alternating current on an output current of the fuel cell, calculate a first low-frequency impedance with respect to the alternating current with regard to any of the plurality of cells based on the current detected by the current detector and the voltage detected by the first voltage detector, calculate a second low-frequency impedance of an entire fuel cell with respect to the alternating current or a third low-frequency impedance with respect to the alternating current with regard to a reference cell selected in advance among the plurality of cells as one of the cells in which an oxygen deficiency is unlikely to occur based on the current detected by the current detector and the voltages detected by the first and second voltage detectors, calculate a reference impedance based on the calculated second or third low-frequency impedance, determine whether an absolute value of the calculated first low-frequency impedance is smaller than an absolute value of the reference impedance, and diagnose that any cell is in a state of the oxygen deficiency when it is determined that the absolute value of the calculated first low-frequency impedance is smaller than the absolute value of the reference impedance.

According to this diagnostic device, it can be diagnosed whether any of the cells is in the state of the oxygen deficiency by the reference impedance being compared to the cell impedance and without the amount of a decrease in an output voltage of the cell being used.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, a fuel cell system 1 to which a diagnostic device 5 according to an embodiment of the invention is applied will be described with reference to accompanying drawings. The diagnostic device 5 according to this embodiment is applied to a fuel cell vehicle as a type of electric car. The diagnostic device 5 according to this embodiment diagnoses a state of a fuel cell 10 that is mounted in the vehicle.

The fuel cell 10 outputs electric energy by using an electrochemical reaction of reaction gases such as a fuel gas including a hydrogen gas and an oxidant gas including an oxygen gas (air in this example). In this embodiment, a solid polymer-type fuel cell is adopted as the fuel cell 10.

Figure 1:
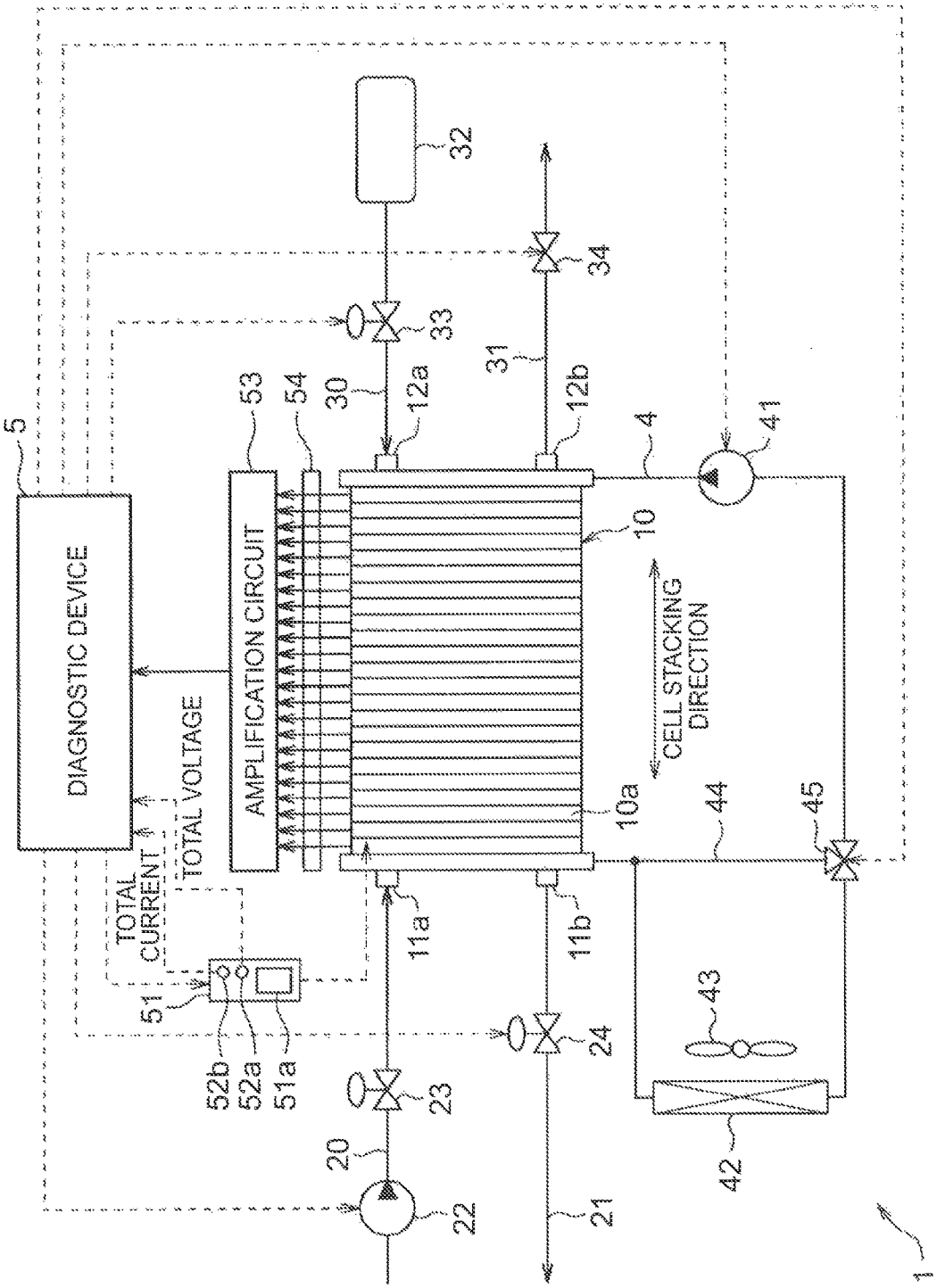
FIG. 1 is an overall configuration diagram illustrating a fuel cell system according to an embodiment of the invention.

As illustrated in FIG. 1, which is an overall configuration diagram, the fuel cell 10 supplies DC electric power that is generated by electric power generation to electrical loads (not illustrated), such as an electric motor mainly for vehicle traveling and a secondary battery, via a DC-DC converter 51a.

The fuel cell 10 according to this embodiment is a stack structure in which a plurality of cells 10a are stacked as minimum units. The fuel cell 10 according to this embodiment is configured as a serial connection body in which the plurality of cells 10a are electrically connected in series.

Figure 2:
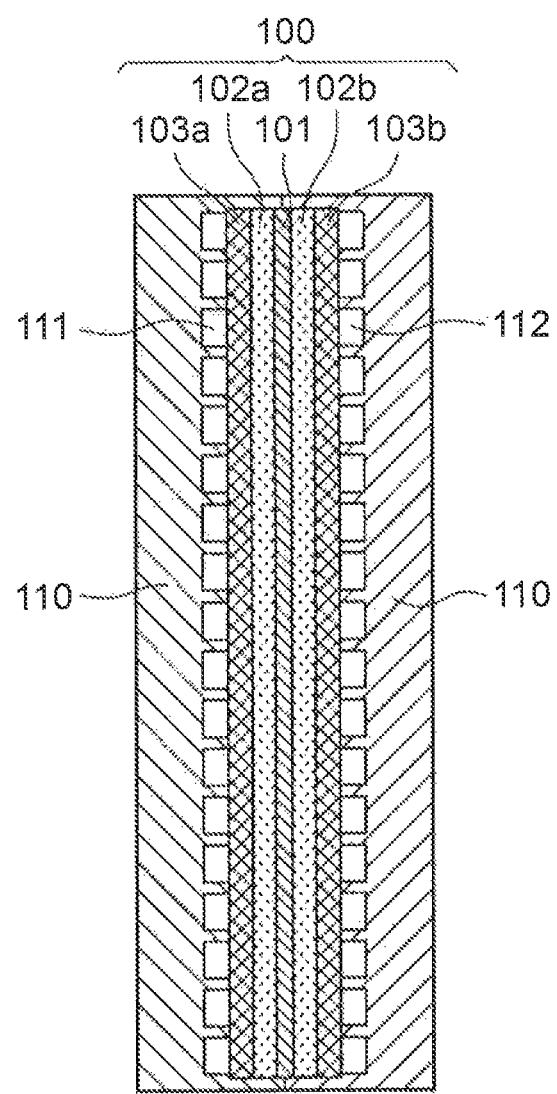
FIG. 2 is a schematic sectional view of a single cell according to the embodiment.

As illustrated in FIG. 2, which is a sectional view, a membrane electrode assembly 100 that is configured by a pair of catalyst layers 102a, 102b pinching both sides of an electrolyte membrane 101, a pair of diffusion layers 103a, 103b that are placed on both sides of the membrane electrode assembly 100, and separators 110 that pinch these constitute the plurality of cells 10a.

The electrolyte membrane 101 is a proton-conducting ion exchange membrane that is formed by the use of a hydrous polymer material such as fluorocarbon-based and hydrocarbon-based polymer materials.

Figure 3:
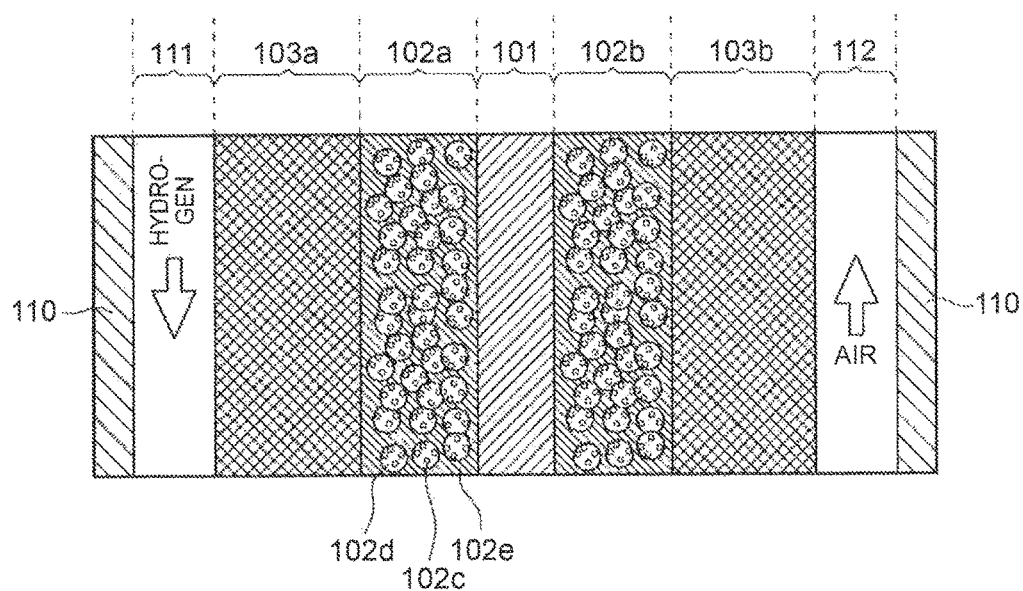
FIG. 3 is a schematic sectional view illustrating an internal structure of the single cell according to the embodiment.

Each of the pair of catalyst layers 102a, 102b constitutes an electrode. The anode side catalyst layer 102a that constitutes an anode electrode and the cathode side catalyst layer 102b that constitutes a cathode electrode constitute the pair of catalyst layers 102a, 102b. As illustrated in FIG. 3, which is a schematic diagram, materials (such as platinum particles) 102c that exert a catalytic action, carrying carbons 102d that carry the materials 102c, and an ionomer (electrolyte polymer) 102e that covers the carrying carbons 102d constitute each of the catalyst layers 102a, 102b.

The diffusion layers 103a, 103b diffuse the reaction gas to the catalyst layers 102a, 102b, respectively. A porous member that has gas permeability and electron conductivity (such as carbon paper and a carbon cloth) constitutes the diffusion layers 103a, 103b.

An electrically conductive carbonaceous base material is an example of a material that constitutes the separator 110. A hydrogen flow path 111 through which the fuel gas flows is formed at a site of each of the separators 110 that faces the anode side catalyst layer 102a. An air flow path 112 through which the oxidant gas flows is formed at a site of each of the separators 110 that faces the cathode side catalyst layer 102b.

Once the fuel gas and the oxidant gas are supplied, each of the plurality of cells 10a outputs the electric energy, by the electrochemical reaction of the hydrogen gas and the oxygen gas, as follows.

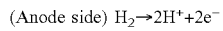

(Anode side) $H_2 \rightarrow 2H^+ + 2e^-$

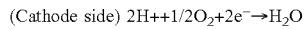

(Cathode side) $2H^+ + 1/2O_2 + 2e^- \rightarrow H_2O$

Referring back to FIG. 1, the fuel cell 10 is electrically connected to the various electrical loads via the DC-DC converter 51a that is capable of bidirectional electric power supply. The DC-DC converter 51a, a voltage sensor 52a, and a current sensor 52b constitute a current control device 51. The DC-DC converter 51a controls an electric power flow from the fuel cell 10 to the various electrical loads or from the various electrical loads to the fuel cell 10.

The diagnostic device 5, which diagnoses a deficiency of the hydrogen gas and a deficiency of the oxygen gas in the cells 10a, is connected to the fuel cell 10 according to this embodiment. The diagnostic device 5 will be described later.

An air supply pipe 20 and an air discharge pipe 21 are connected to the fuel cell 10 that is illustrated in FIG. 1. The air supply pipe 20 is to supply the air to an air inlet portion 11a. The air discharge pipe 21 is to discharge the air, produced water, and impurities to the outside from an air outlet portion 11b.

The air inlet portion 11a constitutes a gas inlet portion that supplies the oxidant gas to the air flow paths 112 of the plurality of cells 10a. The air outlet portion 11b constitutes a gas outlet portion that discharges the produced water, the impurities, and the air from the air flow paths 112 of the plurality of cells 10a.

An air pump 22 is disposed in a most upstream portion of the air supply pipe 20. The air pump 22 is to pump the air suctioned from an atmosphere to the fuel cell 10. The air pump 22 is an electric pump. A compression mechanism that pumps the air and an electric motor that drives the compression mechanism constitute the air pump 22.

An air pressure regulating valve 23, which adjusts a pressure of the air that is supplied to the fuel cell 10, is disposed on the air supply pipe 20 between the air pump 22 and the fuel cell 10. A valve body that adjusts a degree of opening of an air flow path in the air supply pipe 20 through which the air flows and an electric actuator that drives this valve body constitute the air pressure regulating valve 23.

An electromagnetic valve 24 is disposed on the air discharge pipe 21. The electromagnetic valve 24 is to discharge, to the outside, the air, the produced water, the impurities, and the like present in the fuel cell 10. A valve body that adjusts a degree of opening of an air discharge passage in the air discharge pipe 21 through which the air is discharged and an electric actuator that drives this valve body constitute the electromagnetic valve 24.

A hydrogen supply pipe 30 and a hydrogen discharge pipe 31 are connected to the fuel cell 10, too. The hydrogen supply pipe 30 has a hydrogen supply flow path for supply of hydrogen to a hydrogen inlet portion 12a. The hydrogen discharge pipe 31 is provided with a hydrogen discharge flow path for discharge of a very small amount of unreacted hydrogen or the like to the outside from a hydrogen outlet portion 12b.

The hydrogen inlet portion 12a constitutes a gas inlet portion that supplies the fuel gas to the hydrogen flow paths 111 of the plurality of cells 10a. The hydrogen outlet portion 12b constitutes a gas outlet portion that discharges the unreacted hydrogen or the like from the hydrogen flow paths 111 of the plurality of cells 10a.

A high-pressure hydrogen tank 32 filled with high-pressure hydrogen is disposed in a most upstream portion of the hydrogen supply pipe 30. A hydrogen pressure regulating valve 33, which adjusts a pressure of the hydrogen that is supplied to the fuel cell 10, is disposed on the hydrogen supply pipe 30 between the high-pressure hydrogen tank 32 and the fuel cell 10. A valve body that adjusts a degree of opening of the hydrogen supply flow path in the hydrogen supply pipe 30 and an electric actuator that drives this valve body constitute the hydrogen pressure regulating valve 33.

An electromagnetic valve 34 is disposed on the hydrogen discharge pipe 31. The electromagnetic valve 34 is to discharge the very small amount of unreacted hydrogen or the like to the outside. A valve body that adjusts a degree of opening of the hydrogen discharge flow path in the hydrogen discharge pipe 31 and an electric actuator that drives this valve body constitute the electromagnetic valve 34.

In this embodiment, the pressure regulating valves 23, 33, the electromagnetic valves 24, 34, and the air pump 22 are controlled by the diagnostic device 5.

A cooling water circulation circuit 4 through which cooling water circulates is also connected to the fuel cell 10 as a cooling system that adjusts a temperature of the fuel cell 10. A water pump 41 that circulates the cooling water and a radiator 42, which radiates the cooling water that has passed through the fuel cell 10 by heat exchange between the cooling water and outside air, are disposed in the cooling water circulation circuit 4. The radiator 42 cools the cooling water by using the outside air that is blown by an electric fan 43.

A bypass flow path 44 is disposed in the cooling water circulation circuit 4, too. The bypass flow path 44 allows an inlet of the water pump 41 and a water outlet of the fuel cell 10 to be connected to each other by bypassing the radiator 42. Also disposed is a three-way valve 45 that connects either the bypass flow path 44 or a water outlet of the radiator 42 to the inlet of the water pump 41.

Figure 4:
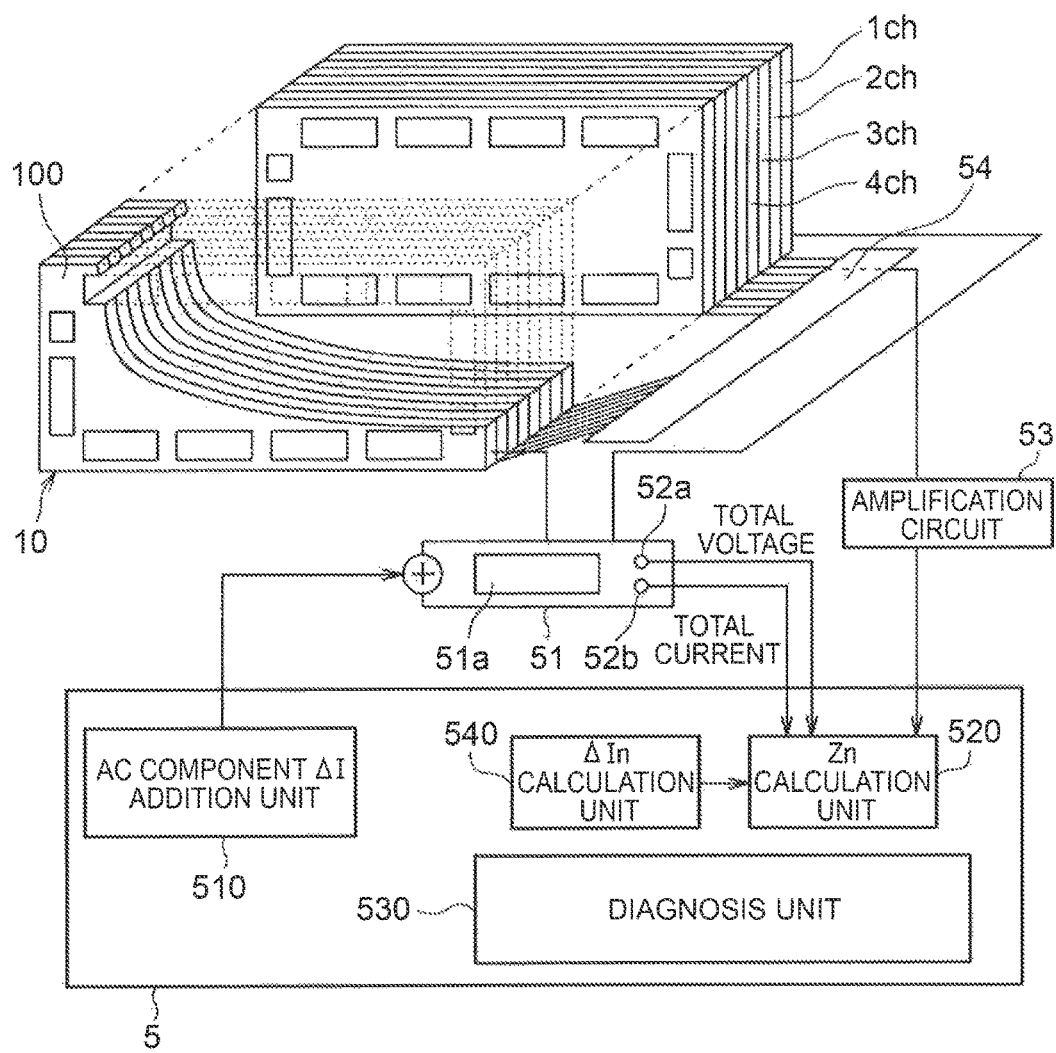
FIG. 4 is a schematic diagram illustrating a diagnostic device according to the embodiment.

Hereinafter, the diagnostic device 5 according to this embodiment will be described with reference to FIG. 4. FIG. 4 shows, in a perspective view, a part of the cells 10$a$ constituting the fuel cell 10 so as to show an internal structure of the fuel cell 10.

A microcomputer, a memory, a digital/analog converter, an analog/digital converter, and the like constitute the diagnostic device 5. Specifically, an AC component ΔI addition unit 510 a ΔIn calculation unit 540, a Zn calculation unit 520, and a diagnosis unit 530 are main components constituting the diagnostic device 5.

Figure 5:
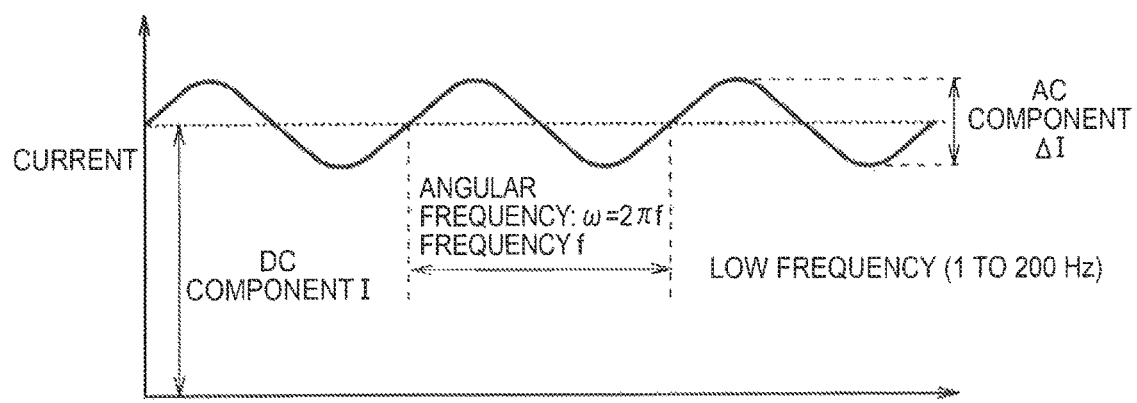
FIG. 5 is an explanatory diagram for showing an alternating current that is superimposed on an output current of a fuel cell by a signal superimposition unit according to the embodiment.

The AC component ΔI addition unit 510 superimposes an alternating current of a low frequency f (AC component ΔI) on an output current of the fuel cell 10 through the DC-DC converter 51$a$. The DC-DC converter 51$a$ is connected to the fuel cell 10, and superimposes the alternating current from the AC component ΔI addition unit 510 on the output current of the fuel cell 10 as illustrated in FIG. 5. A frequency within a range of 1 Hz to 200 Hz, for example, is used as the low frequency f according to this embodiment.

It is desirable that each alternating current that is superimposed in the DC-DC converter 51$a$ is within 10% of the output current (electric power generation current) of the fuel cell 10 in view of an electric power generation state of the fuel cell 10. The alternating current may change in accordance with the electric power generation state of the fuel cell 10, too.

In addition, the AC component ΔI addition unit 510 may be configured to superimpose, through the DC-DC converter 51$a$, alternating currents of a plurality of different frequencies on the output current (electric power generation current) of the fuel cell 10.

The ΔIn calculation unit 540 calculates an AC component ΔIn of the low frequency f (that is, the alternating current of the low frequency f) in a total current I flowing through the fuel cell 10 based on a detection current I of the current sensor 52$b$. A method such as the fast Fourier transform is used when the ΔIn calculation unit 540 according to this embodiment calculates the AC component ΔIn.

The current sensor 52$b$ detects the total current I flowing through the fuel cell 10. The total current I is a current including the output current of the fuel cell 10 (detection current I in FIG. 5) and the alternating current of the low frequency f (AC component ΔI in FIG. 5).

The Zn calculation unit 520 calculates, for each of the cells 10$a$, an AC component ΔV of the low frequency f (that is, an AC voltage of the low frequency f) in a cell voltage output from the cell 10$a$ based on an output voltage of an amplification circuit 53. A method such as the fast Fourier transform is used when the Zn calculation unit 520 according to this embodiment calculates the AC component ΔV.

In addition, the Zn calculation unit 520 calculates, for each of the cells 10$a$, an impedance of the cell 10$a$ with respect to the alternating current by dividing the "AC component ΔV" by the "AC component ΔIn calculated by the ΔIn calculation unit 540" (=ΔV/ΔIn). Hereinafter, the impedance of the cell 10$a$ with respect to the alternating current will be referred to as a cell impedance.

The amplification circuit 53 amplifies and outputs a voltage output from the cell monitor 54 for each of the cells 10$a$. The cell monitor 54 is voltage detection means for detecting voltages output from the cells 10$a$ for each of the cells 10$a$. Accordingly, the amplification circuit 53 amplifies each of the cell voltages output from the plurality of cells 10$a$.

The voltage sensor 52$a$ detects the voltage output from the fuel cell 10 as a whole (that is, all of the plurality of cells 10$a$). Hereinafter, this voltage will be referred to as a total voltage.

The Zn calculation unit 520 calculates an AC component V of the low frequency f (that is, the AC voltage of the low frequency f) in the total voltage based on a detection voltage of the voltage sensor 52$a$. A method such as the fast Fourier transform is used when the Zn calculation unit 520 according to this embodiment calculates the AC component V.

Furthermore, the Zn calculation unit 520 calculates an impedance of the entire fuel cell 10 (that is, all of the plurality of cells 10$a$) with respect to the alternating current (hereinafter, referred to as a stack overall impedance ΣZn) by dividing the "AC component V" by the "AC component ΔIn calculated by the ΔIn calculation unit 540".

The diagnosis unit 530 diagnoses the deficiency of the hydrogen gas and the deficiency of the oxygen gas with regard to any of the cells 10$a$ by comparing an absolute value of the cell impedance of each of the cells 10$a$ to an absolute value of a reference impedance.

Hereinafter, a principle of the diagnosis of the deficiency of the hydrogen gas and the deficiency of the oxygen gas in the fuel cell system 1 according to this embodiment that is based on the comparison between the absolute value of the cell impedance and the absolute value of the reference impedance will be described.

When the deficiency of the hydrogen gas is caused during the electric power generation by the cell 10$a$, a reaction in an air electrode (cathode) changes to a carbon oxidation reaction from an oxygen reduction reaction at a time of normal electric power generation. Hereinafter, the cell 10$a$ subjected to the deficiency of the hydrogen gas will be referred to as a hydrogen gas-deficient cell.

At this time, a reaction resistance of the hydrogen gas-deficient cell becomes far greater than a reaction resistance of the cell 10$a$ having the oxygen reduction reaction. Accordingly, the absolute value of the cell impedance of the hydrogen gas-deficient cell becomes greater than the absolute value of the cell impedance of the cell 10$a$ having the oxygen reduction reaction.

Figure 6:
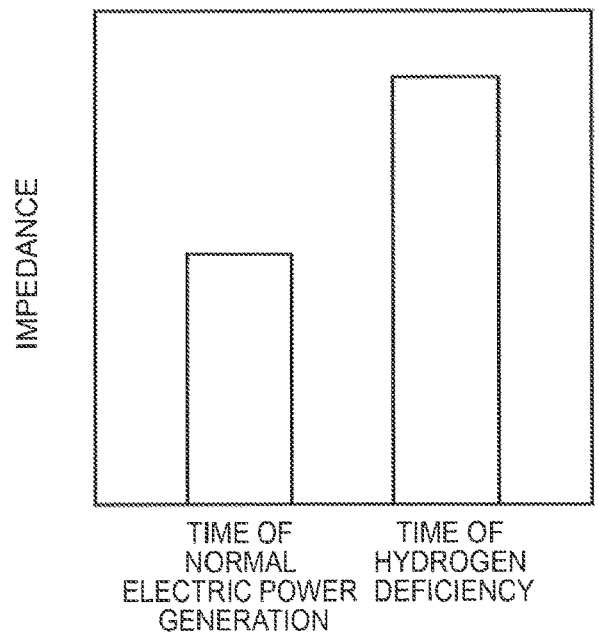
FIG. 6 is a histogram in which a cell impedance at a time of hydrogen deficiency and a cell impedance at a time of normal electric power generation are compared to each other according to the embodiment.

Accordingly, the absolute value of the cell impedance of the cell 10$a$ at a time of hydrogen deficiency becomes greater than the absolute value of the cell impedance of the cell 10$a$ at the time of the normal electric power generation (refer to FIG. 6). The time of the normal electric power generation refers to a no-deficiency state where the hydrogen gas and the oxygen gas are sufficiently supplied to the cell 10$a$ at a time when the electric power generation is performed by the cell 10$a$.

By the above, it is determined whether the absolute value of the cell impedance of any of the cells 10$a$ exceeds the absolute value of the reference impedance with the absolute value of the cell impedance of the cell 10$a$ at the time of the normal electric power generation being used as the reference impedance. Then, it can be diagnosed whether any of the cells 10$a$ is subjected to the deficiency of the hydrogen gas.

When the deficiency of the oxygen gas is caused during the electric power generation by the cell 10a, the reaction in the air electrode changes to a hydrogen pumping reaction from the oxygen reduction reaction at the time of the normal electric power generation. Hereinafter, the cell 10a subjected to the deficiency of the oxygen gas will be referred to as an oxygen-deficient cell.

At this time, a reaction resistance relating to oxygen diffusion disappears in the oxygen-deficient cell, and thus the cell impedance of the oxygen-deficient cell becomes a value close to a high-frequency impedance and the absolute value of the impedance of the oxygen-deficient cell becomes smaller than the absolute value of the impedance of the cell 10a having the oxygen reduction reaction.

The high-frequency impedance refers to an impedance of the cell 10a with respect to a high-frequency alternating current when an alternating current of high frequency (such as 1 kHz) is superimposed on the output current of the fuel cell 10.

Figure 7:
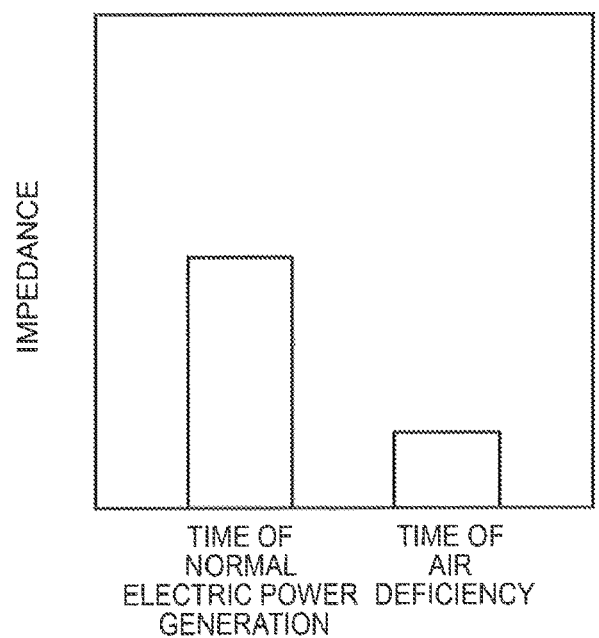
FIG. 7 is a histogram in which a cell impedance at a time of air deficiency (oxygen deficiency) and the cell impedance at the time of the normal electric power generation are compared to each other according to the embodiment.

The absolute value of the impedance of the cell 10a at a time of air (oxygen gas) deficiency becomes smaller than the absolute value of the impedance of the cell 10a at the time of the normal electric power generation (refer to FIG. 7).

By the above, it can be diagnosed whether any of the cells 10a is subjected to the deficiency of the oxygen gas by whether the absolute value of the cell impedance of any of the cells 10a is smaller than the absolute value of the reference impedance being determined.

Hereinafter, an operation of the fuel cell system 1 according to this embodiment will be described.

Firstly, the AC component ΔI addition unit 510 superimposes, through the DC-DC converter 51a, the alternating current of the low frequency f (AC component ΔI) on the output current (electric power generation current) of the fuel cell 10.

The ΔIn calculation unit 540 calculates the AC component ΔIn of the low frequency f in the total current I flowing through the fuel cell 10 based on the detection current I of the current sensor 52b.

The cell monitor 54 detects the output voltages ΔV of the cells 10a for each of the cells 10a. The amplification circuit 53 amplifies and outputs each of the output voltages ΔV of the respective cells 10a output from the cell monitor 54.

The Zn calculation unit 520 calculates the cell impedance of each of the cells 10a based on the output voltage of the amplification circuit 53 and the AC component ΔIn calculated by the ΔIn calculation unit 540.

The Zn calculation unit 520 calculates the stack overall impedance based on the total voltage detected by the voltage sensor 52a and the AC component ΔIn calculated by the ΔIn calculation unit 540.

At this time, the diagnosis unit 530 diagnoses whether any of the cells 10a is deficient in the hydrogen gas and the oxygen gas based on the stack overall impedance and the cell impedance of each of the cells 10a.

Figure 8:
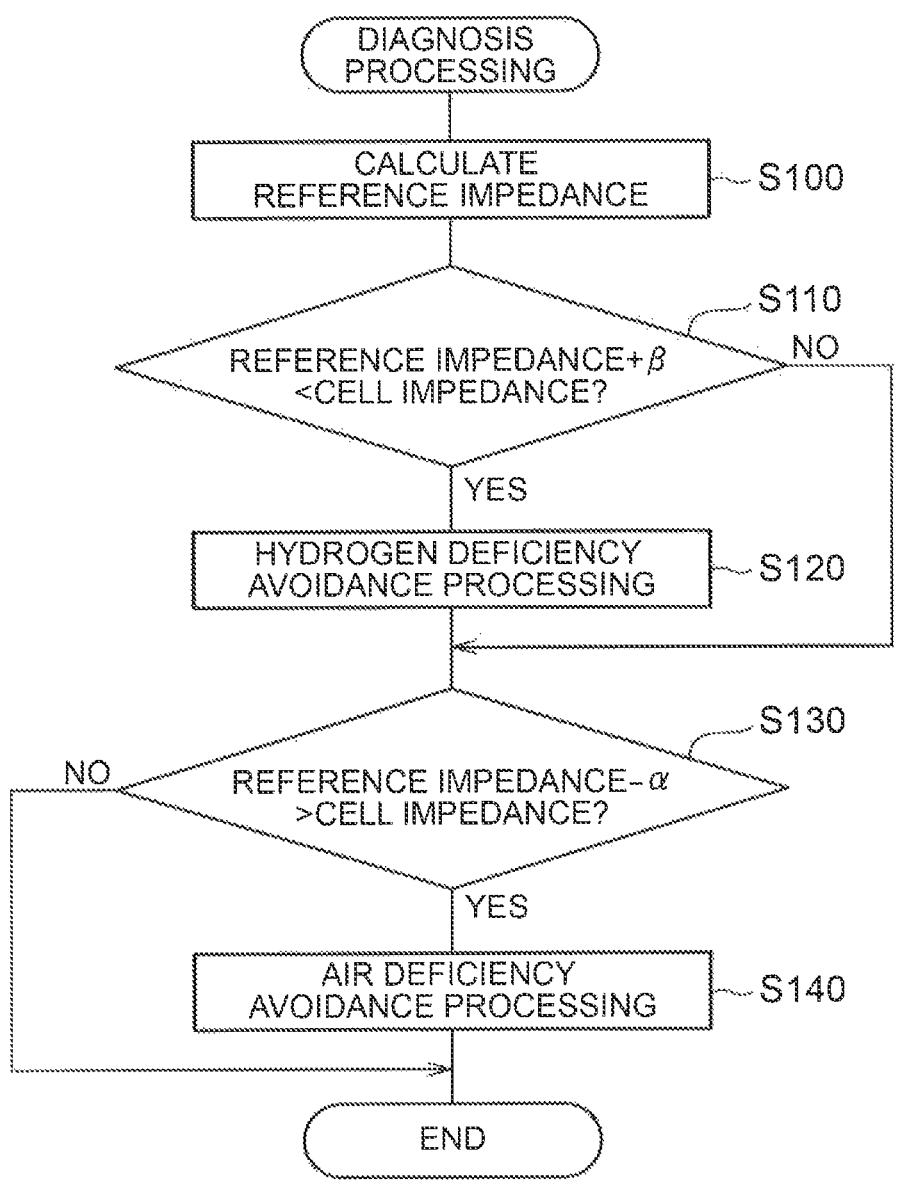
FIG. 8 is a flowchart illustrating a fuel cell diagnosis processing that is executed by the diagnostic device according to the embodiment.

Specifically, the diagnosis unit 530 executes the diagnosis processing in accordance with a flowchart that is illustrated in FIG. 8. FIG. 8 is the flowchart illustrating the diagnosis processing that is executed by the diagnosis unit 530.

Firstly, in Step 100, the reference impedance is calculated that is used for the diagnosis of whether the cell 10a is deficient in the hydrogen gas and the oxygen gas.

The reference impedance is the impedance of the reference cell 10a, which is one of the plurality of cells 10a that is selected in advance. The reference cell 10a is one of the plurality of cells 10a that selected in advance, in which it is assumed that the deficiency of the hydrogen gas and the deficiency of the oxygen gas are unlikely to occur. The selection of the reference cell 10a will be described later.

An average value that is obtained by the stack overall impedance ΣZn being divided by the number N of the cells 10a (=ΣZn/N) may be used, instead of the impedance of the reference cell 10a, as the reference impedance.

Then, in Step 110, (absolute value of the reference impedance+a predetermined value β) is obtained by the predetermined value β being added to the absolute value of the reference impedance, and it is determined whether the absolute value of the cell impedance of any of the cells 10a exceeds the (absolute value of the reference impedance+the predetermined value β). Any of the cells 10a is any one of the plurality of cells 10a. The predetermined value β is a value that is determined in advance for a threshold to be compared to the absolute value of the cell impedance to be adjusted.

When the absolute value of the cell impedance of any of the cells 10a exceeds the (absolute value of the reference impedance+the predetermined value β), for example, a YES determination is made in Step 110. At this time, it is diagnosed that any of the cells 10a is in a state of the hydrogen gas deficiency.

At this time, the fuel cell 10 is subjected to a feedback control so that the state of the hydrogen deficiency of any of the cells 10a is avoided. Specifically, a degree of opening of the hydrogen pressure regulating valve 33 is increased and a degree of opening of the electromagnetic valve 34 is increased.

Then, the amount of the fuel gas supplied from the high-pressure hydrogen tank 32 to the plurality of cells 10a (that is, the hydrogen gas) can be increased. Accordingly, the amount of the hydrogen gas supplied to any of the cells 10a can be increased. In this manner, the state of the hydrogen gas deficiency of any of the cells 10a can be avoided. Subsequently, the processing proceeds to Step 130.

In order to avoid the deficiency of the hydrogen gas, a rotation speed of an electric pump for fuel gas circulation may be increased in a system that has the electric pump for fuel gas circulation for fuel gas pumping with respect to the fuel cell 10. This allows the amount of the hydrogen gas supplied from the high-pressure hydrogen tank 32 to the plurality of cells 10a to increase and the deficiency of the hydrogen gas to be avoided.

A NO determination is made in Step 110 when the absolute value of the cell impedance of any of the cells 10a is smaller than the (absolute value of the reference impedance+the predetermined value β). At this time, it is diagnosed that none of the cells 10a is in the state of the hydrogen gas deficiency. The processing proceeds to Step 130 in this case, too.

Then, in Step 130, (absolute value of the reference impedance−a predetermined value α) is obtained by the predetermined value α being subtracted from the absolute value of the reference impedance, and it is determined whether the absolute value of the cell impedance of any of the cells 10a is smaller than the (absolute value of the reference impedance−the predetermined value α). The predetermined value α is a value that is determined in advance for the threshold to be compared to the absolute value of the cell impedance to be adjusted.

When the absolute value of the cell impedance of any of the cells 10a is smaller than the (absolute value of the reference impedance−the predetermined value α), for example, a YES determination is made in Step 130. At this time, it is diagnosed that any of the cells 10a is in a state of the oxygen gas deficiency.

At this time, the fuel cell 10 is subjected to a feedback control so that the state of the oxygen deficiency of any of the cells 10a is avoided. Specifically, the amount of the air blown from the air pump 22 (that is, the amount of the oxygen gas that is supplied) is increased by a rotation speed of the electric motor of the air pump 22 being increased. Accordingly, the deficiency of the oxygen gas can be avoided.

Alternatively, a degree of opening of the air pressure regulating valve 23 is increased and a degree of opening of the electromagnetic valve 24 is increased. Accordingly, the deficiency of the oxygen gas can be avoided, because water inhibiting oxygen gas transport is removed by a volumetric flow rate of the air blown from the air pump 22 being increased.

In this manner, the state of the oxygen gas deficiency of any of the cells 10a can be avoided by the amount of the air (that is, the oxygen gas) supplied to any of the cells 10a being increased.

This diagnosis processing is carried out for each of the plurality of cells 10a. When the deficiency of the hydrogen gas has occurred, a hydrogen gas deficiency avoidance control (Step 120) is carried out. Then, the deficiency of the hydrogen gas can be avoided. When the deficiency of the oxygen gas has occurred, an oxygen gas deficiency avoidance control (Step 140) is carried out. Then, the deficiency of the oxygen gas can be avoided. When both the deficiency of the oxygen gas and the deficiency of the hydrogen gas have occurred, both the hydrogen gas deficiency avoidance control (Step 120) and the oxygen gas deficiency avoidance control (Step 140) are carried out. Then, the deficiency of the hydrogen gas and the deficiency of the oxygen gas can be avoided.

According to this embodiment described above, the AC component ΔI addition unit 510 superimposes the alternating current on the output current of the fuel cell 10 in the diagnostic device that diagnoses the state of the fuel cell 10 in which the plurality of cells 10a are stacked to generate the electric energy by using the electrochemical reaction of the oxygen gas and the hydrogen gas. The cell monitor 54 detects the output voltage ΔV of each of the cells 10a. The ΔIn calculation unit 540 detects the total current flowing through the plurality of cells 10a. The Zn calculation unit 520 calculates the cell impedance with respect to the alternating current with regard to any of the plurality of cells 10a. The absolute value of the impedance of the cell 10a at the time of the hydrogen deficiency becomes greater than the absolute value of the impedance of the cell 10a at the time of the normal electric power generation. The time of the normal electric power generation refers to the no-deficiency state where the hydrogen gas and the oxygen gas are sufficiently supplied to the cell 10a at a time when the electrochemical reaction is performed by the cell 10a.

The diagnostic device 5 can diagnose that any of the cells 10a is in the state of the hydrogen gas deficiency when it is determined that the absolute value of the cell impedance of any of the cells 10a exceeds the (absolute value of the reference impedance+the predetermined value β).

The absolute value of the impedance of the cell 10a at the time of the oxygen gas deficiency becomes smaller than the absolute value of the impedance of the cell 10a at the time of the normal electric power generation. The diagnostic device 5 can diagnose that any of the cells 10a is in the state of the oxygen gas deficiency when it is determined that the absolute value of the cell impedance is smaller than the (absolute value of the reference impedance−the predetermined value α).

Accordingly, the diagnostic device 5 can diagnose that any of the cells 10a is in the state of the hydrogen gas deficiency by comparing the absolute value of the reference impedance to the absolute value of the cell impedance and without using the amount of a decrease in the output voltage of the cell 10a.

When the diagnostic device 5 diagnoses that the cell 10a is subjected to the deficiency of the hydrogen gas, the deficiency of the hydrogen gas of the cell 10a can be avoided by the fuel cell 10 being controlled. When the diagnostic device 5 diagnoses that the cell 10a is subjected to the deficiency of the oxygen gas, the deficiency of the oxygen gas of the cell 10a can be avoided by the fuel cell 10 being controlled. When the diagnostic device 5 diagnoses that the cell 10a is subjected to the deficiency of the oxygen gas and the deficiency of the hydrogen gas, the deficiency of the oxygen gas and the deficiency of the hydrogen gas of the cell 10a can be avoided by the fuel cell 10 being controlled.

Hereinafter, the selection of the reference cell 10a according to this embodiment will be described.

Firstly, the reference cell 10a for hydrogen gas deficiency diagnosis can be selected as follows. For example, one of the plurality of cells 10a that is likely to have a highest fuel gas (hydrogen gas) flow velocity can be selected as the reference cell 10a. More specifically, one of the plurality of cells 10a that is on an upstream side in a fuel gas flow direction (that is, on the high-pressure hydrogen tank 32 side) is likely to have the highest fuel gas (hydrogen gas) flow velocity, and thus this cell 10a on the upstream side in the fuel gas flow direction can be selected as the reference cell 10a.

In addition, one of the plurality of cells 10a that is on a central side in a cell stacking direction can be selected as the reference cell 10a. One of the plurality of cells 10a that is on an end side in the cell stacking direction is likely to be subjected to radiation, and thus is likely to be subjected to water clogging in the hydrogen flow path 111 and the deficiency of the hydrogen gas. In contrast, the one of the plurality of cells 10a that is on the central side in the cell stacking direction is less likely to be subjected to radiation, and thus is less likely to be subjected to the deficiency of the hydrogen gas attributable to water clogging.

The reference cell 10a for oxygen gas deficiency diagnosis can be selected as follows. For example, one of the plurality of cells 10a that is likely to have a highest air (oxygen gas) flow velocity can be selected as the reference cell 10a. More specifically, one of the plurality of cells 10a in the fuel cell 10 that is on an upstream side in an air flow direction (that is, on the air pump 22 side) is likely to have the highest air flow velocity, and thus this cell 10a on the upstream side in the air flow direction can be selected as the reference cell 10a.

In addition, one of the plurality of cells 10a that is on the central side in the cell stacking direction can be selected as the reference cell 10a. One of the plurality of cells 10a that is on the end side in the cell stacking direction is likely to be subjected to radiation, and thus is likely to be subjected to water clogging in the air flow path 112 and the deficiency of the oxygen gas. In contrast, the one of the plurality of cells 10a that is on the central side in the cell stacking direction is less likely to be subjected to the deficiency of the oxygen gas attributable to the water clogging in the air flow path 112.

Other Embodiments (1) In the embodiment described above, an example has been described in which the hydrogen gas deficiency and the oxygen gas deficiency are diagnosed based on the cell impedance of any one of the plurality of cells 10*a*. This may be replaced with the following (a) and (b) instead.

(a) Firstly, a total number of the cells 10*a* that constitute the fuel cell 10 is regarded as N, and the number of any of the cells 10*a* is regarded as M. In this case, M is an integer that is equal to or greater than two and satisfies M<N.

A sum total that is obtained by addition of the absolute values of the impedances of any M cells 10*a* among the N cells 10*a* is calculated as the absolute value of the cell impedance.

In this case, "(absolute value of the reference impedance+the predetermined value $\beta$)×N" is regarded as a first threshold. By whether the absolute value of the cell impedance exceeds the first threshold being determined, it is diagnosed whether the deficiency of the hydrogen gas has occurred in any M cells 10*a*.

"(Absolute value of the reference impedance−the predetermined value $\alpha$)×N" is regarded as a second threshold. By whether the absolute value of the cell impedance exceeds the second threshold being determined, it is diagnosed whether the deficiency of the oxygen gas has occurred in any M cells 10*a*.

(b) An average value Zav of the absolute values of the impedances of any M cells 10*a* among the N cells 10*a* is calculated as the absolute value of the cell impedance.

In this case, it is diagnosed whether the deficiency of the hydrogen gas has occurred in any M cells 10*a* by whether the absolute value of the cell impedance exceeds the (absolute value of the reference impedance+the predetermined value $\beta$) being determined.

In addition, it is diagnosed whether the deficiency of the oxygen gas has occurred in any M cells 10*a* by whether the absolute value of the cell impedance is smaller than the (absolute value of the reference impedance−the predetermined value $\alpha$) being determined.

In this manner, whether the deficiency of the hydrogen gas or the deficiency of the oxygen gas has occurred can be diagnosed by (a) and (b) with regard to the respective N cells 10*a* for each of the M cells 10*a*.

(2) In the embodiment described above, an example has been described in which the electric energy is output through the electrochemical reaction of the hydrogen gas and the oxygen gas, which are gases, in the fuel cell 10. This may be replaced with the following (c) and (d) instead.

(c) Liquid hydrogen or a hydrogen-containing liquid fuel is used during the electric power generation by the fuel cell 10 based on the electrochemical reaction. (d) An oxidizing agent of liquid oxygen or an oxygen-containing liquid is used during the electric power generation by the fuel cell 10 based on the electrochemical reaction.

(3) in the embodiment described above, an example has been described in which the air pump 22, the air pressure regulating valve 23, and the electromagnetic valve 24 are respectively controlled to avoid the state of the oxygen gas deficiency in any of the cells 10*a*. This may be replaced with the following (e) and (f) instead.

(e) The diagnostic device 5 increases the amount of the air blown from the air pump 22 without changing the degree of opening of the air pressure regulating valve 23 and the degree of opening of the electromagnetic valve 24. Then, the amount of the air that is blown and supplied from the air pump 22 to the fuel cell 10 can be increased.

(f) The diagnostic device 5 increases the degree of opening of the air pressure regulating valve 23 and increases the degree of opening of the electromagnetic valve 24 without changing the amount of the air blown from the air pump 22 to the fuel cell 10. Then, a pressure loss of the flow of the air blown to the fuel cell 10 can be reduced. Accordingly, the amount of the air that is blown and supplied from the air pump 22 to the fuel cell 10 can be increased.

(4) In the embodiment described above, an example has been described in which the fuel cell system according to the invention is applied to the electric car. The fuel cell system according to the invention may be an installation-type fuel cell system instead.

(5) The invention is not limited to the embodiments described above and can be appropriately modified without departing from the scope of the claims. It is a matter of course that the elements that constitute the embodiments described above are optional except for a case where it is clarified that the elements are indispensable, a case where the elements are regarded as being indispensable in principle, and the like. In addition, the invention is not limited to specific numbers except for a case where figures regarding the elements constituting the embodiments such as the numbers, numerical values, amounts, and ranges of the elements are mentioned in the embodiments described above, a case where it is clarified that the numbers are essential, a case where the invention is limited to certain numbers in principle, and the like. Furthermore, the invention is not limited to shapes, positional relationships, and the like of the elements mentioned in the embodiments described above except for a case where the invention is limited to the shapes, the positional relationships, and the like in principle and a case where this is clarified.

Step 100 can be regarded as second calculation means, Step 110 can be regarded as first determination means, Step 130 can be regarded as second determination means and third determination means, and Step 120 can be regarded as first control means. The hydrogen pressure regulating valve 33 and the electromagnetic valve 34 can be regarded as first adjustment means, the air pump 22, the air pressure regulating valve 23, and the electromagnetic valve 24 can be regarded as second adjustment means, and Step 140 can be regarded as second control means.

What is claimed is:

1. A diagnostic device diagnosing a state of a fuel cell in which a plurality of cells generating electric energy by using an electrochemical reaction of an oxidizing agent containing oxygen and a fuel containing hydrogen are stacked, the diagnostic device comprising:

signal superimposition means for superimposing an alternating current on an output current of the fuel cell;

first voltage detection means for detecting each of voltages output from the respective cells;

second voltage detection means for detecting a voltage output from the fuel cell;

current detection means for obtaining a current flowing through the plurality of cells;

first calculation means for calculating a first low-frequency impedance with respect to the alternating current with regard to any of the plurality of cells based on the current detected by the current detection means and the voltage detected by the first voltage detection means;

second calculation means for calculating a second low-frequency impedance of an entire fuel cell with respect to the alternating current or a third low-frequency impedance with respect to the alternating current with regard to a reference cell selected in advance among the plurality of cells as one of the cells in which a hydrogen deficiency is unlikely to occur based on the current detected by the current detection means and the voltages detected by the first and second voltage detection means and calculating a reference impedance based on the calculated second or third low-frequency impedance; and first determination means for determining whether an absolute value of the first low-frequency impedance calculated by the first calculation means exceeds an absolute value of the reference impedance, wherein the first determination means diagnoses that any cell is in a state of the hydrogen deficiency when the first determination means determines that the absolute value of the first low-frequency impedance calculated by the first calculation means exceeds the absolute value of the reference impedance.

2. The diagnostic device according to claim 1, further comprising:

first adjustment means for adjusting an amount of the fuel supplied to the fuel cell; and first control means for controlling the first adjustment means such that the amount of the fuel supplied to the fuel cell is increased to avoid the state of the hydrogen deficiency in any cell, when it is diagnosed that any cell is in the state of the hydrogen deficiency.

3. The diagnostic device according to claim 1, further comprising:

second determination means for determining whether the absolute value of the first low-frequency impedance calculated by the first calculation means is smaller than the absolute value of the reference impedance, wherein the first determination means diagnoses that any cell is in a state of an oxygen deficiency when the second determination means determines that the absolute value of the first low-frequency impedance calculated by the first calculation means is smaller than the absolute value of the reference impedance.

4. The diagnostic device according to claim 3, further comprising:

second adjustment means for adjusting an amount of the oxidizing agent supplied to the fuel cell; and second control means for controlling the second adjustment means such that the amount of the oxidizing agent supplied to the fuel cell is increased to avoid the state of the oxygen deficiency in any cell, when it is diagnosed that any cell is in the state of the oxygen deficiency.

5. The diagnostic device according to claim 1, further comprising:

a voltage amplification circuit amplifying the voltages detected by the first voltage detection means fir each of the cells, wherein the first calculation means calculates the first low-frequency impedance of any cell based on the current detected by the current detection means and an output voltage of the voltage amplification circuit, and the second calculation means calculates the reference impedance of the reference cell based on the current detected by the current detection means and the output voltage of the voltage amplification circuit.

6. The diagnostic device according to claim 1, wherein the first calculation means calculates the first low-frequency impedances of any two or more of the plurality of cells.

7. A diagnostic device diagnosing a state of a fuel cell in which a plurality of cells generating electric energy by using an electrochemical reaction of an oxidizing agent containing oxygen and a fuel containing hydrogen are stacked, the diagnostic device comprising:

signal superimposition means for superimposing an alternating current on an output current of the fuel cell;

first voltage detection means for detecting each of voltages output from the respective cells;

second voltage detection means for detecting a voltage output from the fuel cell;

current detection means for obtaining a current flowing through the plurality of cells;

first calculation means for calculating a first low-frequency impedance with respect to the alternating current with regard to any of the plurality of cells based on the current detected by the current detection means and the voltage detected by the first voltage detection means;

second calculation means for calculating a second low-frequency impedance of an entire fuel cell with respect to the alternating current or a third low-frequency impedance with respect to the alternating current with regard to a reference cell selected in advance among the plurality of cells as one of the cells in which an oxygen deficiency is unlikely to occur based on the current detected by the current detection means and the voltages detected by the first and second voltage detection means and calculating a reference impedance based on the calculated second or third low-frequency impedance; and determination means for determining whether an absolute value of the first low-frequency impedance calculated by the first calculation means is smaller than an absolute value of the reference impedance, wherein the determination means diagnoses that any cell is in a state of the oxygen deficiency when the determination means determines that the absolute value of the first low-frequency impedance calculated by the first calculation means is smaller than the absolute value of the reference impedance.

8. A diagnostic device which diagnoses a state of a fuel cell in which a plurality of cells that generates electric energy by an electrochemical reaction of an oxidizing agent containing oxygen and a fuel containing hydrogen are stacked, the diagnostic device comprising:

a first voltage detector that detects each of voltages output from the respective cells;

a second voltage detector that detects a voltage output from the fuel cell;

a current detector that obtains a current flowing through the plurality of cells; and a controller configured to superimpose an alternating current on an output current of the fuel cell, calculate a first low-frequency impedance with respect to the alternating current with regard to any of the plurality of cells based on the current detected by the current detector and the voltage detected by the first voltage detector, calculate a second low-frequency impedance of an entire fuel cell with respect to the alternating current or a third low-frequency impedance with respect to the alternating current with regard to a reference cell selected in advance among the plurality of cells as one of the cells in which a hydrogen deficiency is unlikely to occur based on the current detected by the current detector and the voltages detected by the first and second voltage detectors and calculate a reference impedance based on the calculated second or third low-frequency impedance, determine whether an absolute value of the calculated first low-frequency impedance exceeds an absolute value of the reference impedance, and diagnose that any cell is in a state of the hydrogen deficiency when it is determined that the absolute value of the calculated first low-frequency impedance exceeds the absolute value of the reference impedance.

9. The diagnostic device according to claim 8, further comprising:
a first adjustment device configured to adjust an amount of the fuel supplied to the fuel cell,
wherein the controller is configured to control the first adjustment device such that the amount of the fuel supplied to the fuel cell is increased to avoid the state of the hydrogen deficiency in any cell, when it is diagnosed that any cell is in the state of the hydrogen deficiency.

10. The diagnostic device according to claim 8,
wherein the controller is configured to determine whether the absolute value of the calculated first low-frequency impedance is smaller than the absolute value of the reference impedance, and
the controller is configured to diagnose that any cell is in a state of an oxygen deficiency when it is determined that the absolute value of the calculated first low-frequency impedance is smaller than the absolute value of the reference impedance.

11. The diagnostic device according to claim 10, further comprising:
a second adjustment device configured to adjust an amount of the oxidizing agent supplied to the fuel cell,
wherein the controller is configured to control the second adjustment device such that the amount of the oxidizing agent supplied to the fuel cell is increased to avoid the state of the oxygen deficiency in any cell, when it is diagnosed that any cell is in the state of the oxygen deficiency.

12. The diagnostic device according to claim 8, further comprising:
a voltage amplification circuit configured to the voltages detected by the first voltage detector for each of the cells,
wherein the controller is configured to calculate the first low-frequency impedance of any cell based on the current detected by the current detector and an output voltage of the voltage amplification circuit and calculate the reference impedance of the reference cell based on the current detected by the current detector and the output voltage of the voltage amplification circuit.

13. The diagnostic device according to claim 8,
wherein the controller is configured to calculate the first low-frequency impedances of any two or more of the plurality of cells.

14. A diagnostic device which diagnoses a state of a fuel cell in which a plurality of cells that generates electric energy by an electrochemical reaction of an oxidizing agent containing oxygen and a fuel containing hydrogen are stacked, the diagnostic device comprising:
a first voltage detector that detects each of voltages output from the respective cells;
a second voltage detector that detects a voltage output front the fuel cell;
a current detector that obtains a current flowing through the plurality of cells; and
a controller configured to superimpose an alternating current on an output current of the fuel cell, calculate a first low-frequency impedance with respect to the alternating current with regard to any of the plurality of cells based on the current detected by the current detector and the voltage detected by the first voltage detector, calculate a second low-frequency impedance of an entire fuel cell with respect to the alternating current or a third low-frequency impedance with respect to the alternating current with regard to a reference cell selected in advance among the plurality of cells as one of the cells in which an oxygen deficiency is unlikely to occur based on the current detected by the current detector and the voltages detected by the first and second voltage detectors, calculate a reference impedance based on the calculated second or third low-frequency impedance, determine whether an absolute value of the calculated first low-frequency impedance is smaller than an absolute value of the reference impedance, and diagnose that any cell is in a state of the oxygen deficiency when it is determined that the absolute value of the calculated first low-frequency impedance is smaller than the absolute value of the reference impedance.

* * * * *